(12) United States Patent
Allan et al.

(10) Patent No.: US 6,972,574 B2
(45) Date of Patent: *Dec. 6, 2005

(54) METHOD AND APPARATUS FOR MONITORING INTEGRITY OF WIRES OR ELECTRICAL CABLES

(75) Inventors: Gregory Allan, McDonald, PA (US); Rollin Van Alstine, Lecanto, FL (US)

(73) Assignee: CM Technologies Corporation, Coraopolis, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/720,236

(22) Filed: Nov. 25, 2003

(65) Prior Publication Data

US 2004/0183544 A1    Sep. 23, 2004

Related U.S. Application Data

(63) Continuation-in-part of application No. 10/066,197, filed on Jan. 31, 2002, now Pat. No. 6,686,746.

(60) Provisional application No. 60/265,117, filed on Jan. 31, 2001.

(51) Int. Cl.[7] .............................................. G01R 31/11
(52) U.S. Cl. ....................... 324/533; 324/525
(58) Field of Search ................................ 324/533, 534, 324/522–525, 527–528

(56) References Cited

U.S. PATENT DOCUMENTS

| | | | |
|---|---|---|---|
| 4,422,034 A | 12/1983 | Matsuno et al. | ................ 324/51 |
| 4,472,676 A | 9/1984 | Eichmann et al. | ............. 324/51 |
| 4,857,830 A | 8/1989 | Matsuno | ....................... 324/62 |
| 4,980,645 A | 12/1990 | Soma et al. | ................. 324/541 |
| 5,068,614 A | 11/1991 | Fields et al. | ................. 324/534 |
| 5,083,086 A | 1/1992 | Steiner | ......................... 324/533 |
| 5,194,817 A | 3/1993 | Ward | ........................... 324/544 |
| 5,321,632 A * | 6/1994 | Otsuji et al. | ................. 702/159 |
| 5,469,066 A | 11/1995 | Ito et al. | ...................... 324/551 |
| 5,479,610 A | 12/1995 | Roll-Mecak et al. | .... 395/183.01 |
| 5,751,149 A | 5/1998 | Oberg et al. | ................. 324/533 |
| 5,754,053 A | 5/1998 | Bourdeau | .................... 324/533 |
| 5,894,223 A | 4/1999 | Medelius et al. | ............ 324/529 |
| 5,977,772 A | 11/1999 | Medelius et al. | ............ 324/520 |
| 5,994,905 A * | 11/1999 | Franchville | .................. 324/533 |
| 6,281,685 B1 * | 8/2001 | Tuttle | ........................... 324/529 |

* cited by examiner

*Primary Examiner*—Anjan Deb
*Assistant Examiner*—M. Kramskaya
(74) *Attorney, Agent, or Firm*—Fitzpatrick, Cella, Harper & Scinto

(57) ABSTRACT

An apparatus for monitoring the integrity of a wire is provided, which includes a TDR instrument for generating a pulse waveform for transmission through the wire. The apparatus also includes a function generator for generating an electrical or non-electrical forcing waveform for transmission through the wire. The pulse waveform is transmitted through the wire in combination with the forcing waveform and a detector measures a change in dissipation factor values along the wire.

12 Claims, 15 Drawing Sheets

Schematic Block Diagram

TDR Signature from a Short Circuited Wire.

METHOD AND APPARATUS FOR MONITORING INTEGRITY OF WIRES OR ELECTRICAL CABLES

CROSS REFERENCE TO RELATED APPLICATION

This application is a continuation-in-part of U.S. patent application Ser. No. 10/066,197, filed on Jan. 31, 2002, now U.S. Pat. No. 6,686,746, which claims the benefit of, and incorporates by reference, U.S. Provisional Patent Application No. 60/265,117, filed Jan. 31, 2001. The entire disclosure of each prior patent application is incorporated herein by reference.

BACKGROUND OF THE INVENTION

1. Field of the Invention

The present invention pertains to a method and apparatus for monitoring the integrity of wires or electrical cables, or the like, including but not limited to detecting faults or defects in the same.

2. Related Background Art

Various methods for monitoring the integrity of wires, such as detecting faults in a wire, are known. One such method is time domain reflectometry (TDR). TDR operates as follows. First, a fast rise time pulse is injected into a wire. Then, if the pulse encounters an impedance which is not equal to the source impedance of the TDR pulse generator, such as may be caused by a fault in the wire, the pulse is reflected back toward the injection point. Finally, the reflection of the pulse is captured by the TDR instrument and is measured and analyzed. The reflected voltage waveform represents the distributed impedance of the wire under test as a function of time. Where there is a fault in the wire under test, the normal impedance of the wire is changed, resulting in a mismatch between the impedance at the fault location and the impedance at a non-fault location. This mismatch will appear as a noticeable change in the reflected voltage waveform. Thus the voltage waveform (the TDR "signature") serves to detect faults.

More specifically, TDR signatures can be used to determine the nature, magnitude and location of a fault. The nature of the change in the TDR signature, for example, whether the change is an increase or a decrease in voltage, may indicate the nature of the fault, for example, whether the fault is an open circuit or a short circuit. The magnitude of the change in the voltage waveform is proportional to the magnitude of the fault. The location of the fault may be determined as follows. When the pulse output by the TDR reaches the fault, a portion of the TDR pulse is reflected back to the TDR. The speed at which the TDR pulse travels along the wire can be determined either by empirically measuring it by using TDR on a wire of known length, or by referring to standard tables available from wire manufacturers. The time at which the TDR pulse is sent down the wire and the time at which the reflected portion of the pulse is received back at the injection point can be monitored. The location of the fault (the distance along the wire from the injection point to the fault) can then be calculated from the speed and round-trip travel time of the pulse.

Another known method for monitoring wire integrity involves the measurement of the dissipation factor (DF) of the wire. DF is a function of the wire's impedance, Z. Specifically, $Z = R \pm j*X$, where R=the real part of the impedance=AC resistance;
X=the imaginary part of the impedance=reactance;

and $DF = R/X$.

For example, the DF of an insulated wire may be measured upon the application of an AC voltage thereto. The AC voltage impresses an alternating electric field on the wire under test, exciting the wire under test. This alternating electric field causes any polar dielectric molecules in the dielectric insulation material, such as undesirable water molecules, to also alternate (to align with the field), resulting in the dissipation of energy of the applied field. In the ideal case, no energy of the applied electric field would be dissipated, the AC resistance would be zero, and the DF would also be zero. But in wires containing water or some other polar molecules in the dielectric insulation material, some energy is dissipated, resulting in a non-zero AC resistance and a measurable DF. Further, as insulation materials age, they become less supple and pliable due to a variety of environmental effects. Increased brittleness, in turn, results in greater AC resistance of the molecular motion described above, and hence greater dissipation and higher DF measurements. Thus, measuring the DF value, or the trend of DF values over time, of a wire under test, and comparing these with the DF value for a reference wire of the same type in good condition, provides a useful means for monitoring the physical integrity of wiring and detecting losses in this integrity, such as faults.

The value of DF depends principally on the properties of the dielectric material, the condition of the dielectric material, and the frequency of the applied voltage. Generally, for wire insulation, the smaller the value of DF (i.e. the less energy dissipated), the more effective the insulation material will be. Note that air can also serve as a dielectric (i.e., an uninsulated wire)

Existing fault-detection technology suffers from a number of problems. For example, currently known methods are often inadequate to detect small defects in a wire, such as nicks, chafing, and poor connector contacts, because existing technology is not sensitive enough and yields results (e.g. TDR signatures) that are insufficiently precise. But these types of small defects are of particular importance because, while they do not impair operation of the wiring, they have the potential to become full-fledged faults in the wiring that could cause a severe malfunction while the device connected to the wiring is in operation. Indeed, the very fact that these small defects do not yet impair operation may hinder their detection and thereby exacerbate the problem.

Many of the current problems in fault-detection technology are of particular interest for those in the aircraft industry, an important customer of this technology. Defects such as nicks, chafing, and poor connector contacts are common in aircraft wiring, due, for example, to mechanical abrasion, fluid contamination (by water, hydraulic fluid or other fluids used in aircraft), or heat stress. Also, the particular types of wire insulation commonly used on aircraft are known to acquire similar kinds of small defects as they age. For example, polyimide (Kapton®) insulated wire is known to develop radial cracks over time. Initially, the crack may have no effect on the wire's operation, but it could gradually grow to encircle the entire wire, resulting eventually in a bare, uninsulated wire. It is crucial for aircraft maintenance and repair personnel to detect these defects before they become full-fledged faults, so as to prevent malfunctions of aircraft components that could occur while the aircraft is in operation.

In addition, aircraft generally employ wires which are short and unshielded. Both of these characteristics of aircraft wiring pose difficulties for TDR. TDR is known to have problems in accurately locating a fault a short distance from the injection point, because errors in measurement of the travel time of the TDR pulse have a more significant effect. Again, the non-uniform geometry of unshielded wires yields a less smooth waveform (TDR signature), which is more difficult to interpret.

Another limitation of conventional fault-detection technology is that it requires the use of a baseline or reference value obtained from a faultless wire. For example, conventional TDR testing requires a baseline TDR signature as a reference against which the TDR signatures acquired in actual testing may be compared. Thus wires which are expected to be put into use and hence to require future testing while in use should be tested prior to use, when they are in a virgin state (i.e., pristine condition), in order to obtain the baseline signatures. However, the acquisition of this data is not always possible. There may be wires already in use which need to be tested and for which no baseline data was obtained. Even if baseline data is subsequently obtainable, it may be time-consuming to obtain it.

SUMMARY OF THE INVENTION

To overcome the above-described and other limitations in the art, the present invention relates to a method and apparatus that monitors the integrity of wires (and devices connected to wires) using a synergistic combination of traditional TDR and DF measurement techniques and components, both of which are based on the detection of a change in impedance in the wire under test caused by a defect or fault.

In one aspect of the present invention, there is provided an apparatus for monitoring the integrity of a wire, including a pulse generator for generating a pulse waveform for transmission through the wire, and a function generator for generating a forcing waveform for transmission through the wire in combination with the forcing waveform. A detector measures a change in dissipation factor values along the wire.

In another aspect of the present invention, there is provided a method for monitoring the integrity of a wire, including the steps of generating a pulse waveform for transmission through the wire, generating a forcing waveform for transmission through the wire, transmitting the pulse waveform through the wire in combination with the forcing waveform, and measuring a change in dissipation factor values along the wire.

In another aspect of the present invention, there is provided an apparatus for monitoring the integrity of a wire, including a pulse generator for generating a pulse waveform for transmission through the wire, and a function generator for generating a non-electrical forcing waveform for stimulating the wire. The pulse waveform is transmitted through the wire in combination with the non-electrical forcing function. A detector measures a change in dissipation factor values along the wire.

In another aspect of the present invention, there is provided a method for monitoring the integrity of a wire, including the steps of generating a pulse waveform for transmission through the wire, generating a non-electrical forcing waveform for transmission through the wire, transmitting the pulse waveform through the wire in combination with the non-electrical forcing function, and measuring a change in dissipation factor values along the wire.

These and other aspects of the present invention are described in further detail below.

DETAILED DESCRIPTION OF THE PREFERRED EMBODIMENTS

Figure 1:
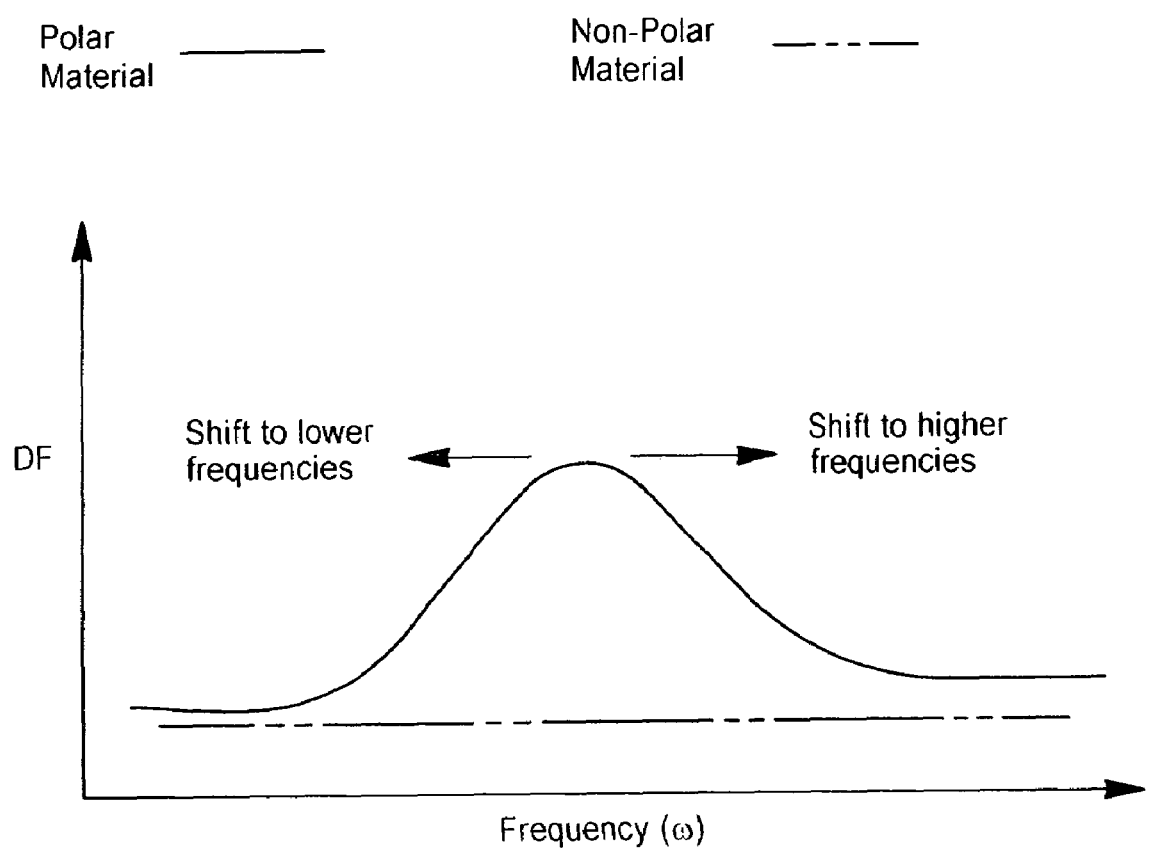
FIG. 1 shows curves of DF versus frequency for polar and non-polar materials.

The method and apparatus of the present invention may be used to test wiring, for example, for periodic routine maintenance, post-installation verification, or troubleshooting, in order to prevent or resolve performance problems caused by defects, damage or deterioration due to aging or environmental factors. The present invention may also be used to determine the location, type and magnitude of a defect or fault in an installed wire or in a device connected to a wire.

The terms "fault" and "defect" are both used to refer to that which is a deviation from a virgin wire. But a "defect" is distinguished from a "fault" in that the presence of a defect does not affect the operation of the wire or the circuit containing the wire, whereas the presence of a "fault" adversely affects the operation of the wire or circuit containing the wire. An example of a fault would be an open or short circuit, and an example of a defect could be a wire having nicked or chafed insulation.

While conventional TDR technology is capable of detecting only faults in a wire, the present invention may detect faults or defects. Further, while conventional TDR technology is generally capable of detecting only the first fault along the wire in the direction away from the injection point of the TDR pulse, the present invention may detect multiple defects or faults along the length of a single wire.

The present invention provides for enhanced sensitivity of the TDR signature response. This enhanced sensitivity of the TDR response is achieved by using TDR in conjunction with the application of an AC voltage (forcing waveform). In the conventional technology, either TDR or DF testing (applying an AC voltage) is used on its own as a means of detecting faults in a wire. In the present invention, an element of the DF testing technique is combined with TDR, and the combination of techniques is itself fine-tuned to obtain optimal results. The enhanced TDR response not only allows for the detection of defects as well as faults, but also makes the testing easier and faster, in that the enhanced TDR signatures are easier for a tester to visually inspect. The enhanced TDR response also makes the detection results more certain. Finally, the enhanced sensitivity facilitates interpretation of the more complex waveforms (TDR signatures) that are obtained from unshielded wires, the type of wires often used in aircraft, on account of their non-uniform geometry. In this type of case, defects that might be missed in conventional TDR testing may be detected on account of the enhanced sensitivity provided by the present invention.

Further, the present invention reduces or eliminates the need for a baseline or reference (e.g. a baseline TDR signature) obtained from a wire in a virgin state, for use as a standard of comparison. Again, the use of the AC voltage to excite the wire under test provides the solution to this problem. The use of the AC voltage allows a baseline or reference TDR signature to be acquired after the wires are no longer in a virgin state and are already in use. Since application of the AC voltage enhances the TDR response, a TDR signature obtained from a given wire in an unexcited state (i.e. with no AC voltage applied to the wire) will differ from a TDR signature obtained from the same wire in an excited state (i.e. with an AC voltage applied to the wire). Thus a TDR signature obtained from a wire in an unexcited state can serve as a baseline or reference against which a TDR signature obtained from the wire in an excited state can be compared. By means of such comparisons, currently existing defects and faults in a wire can be detected without requiring a baseline TDR signature acquired when the wire was pre-operational and in a virgin state.

In addition, in the present invention, the applied AC voltage can be a low voltage, which can avoid risk of damage to the system under test.

FIG. 1 graphically illustrates the variation of DF with the frequency of the AC applied voltage, for polar and non-polar dielectric materials. For polar dielectric materials, the graph of DF versus frequency of the applied AC voltage is typically a bell-shaped curve, with DF reaching a maximum at $\omega_{peak}$, and tapering off relatively evenly in either direction, as the frequency is either decreased or increased from the peak frequency. The DF peak frequency is the frequency at which the wire will be in its lossiest state, i.e., where there will be the greatest leakage current in the wire.

In contrast, non-polar dielectric materials, such as glass, whose molecules do not rotate under an applied electric field, exhibit a near constant DF value over a wide range of frequencies.

Figure 2:
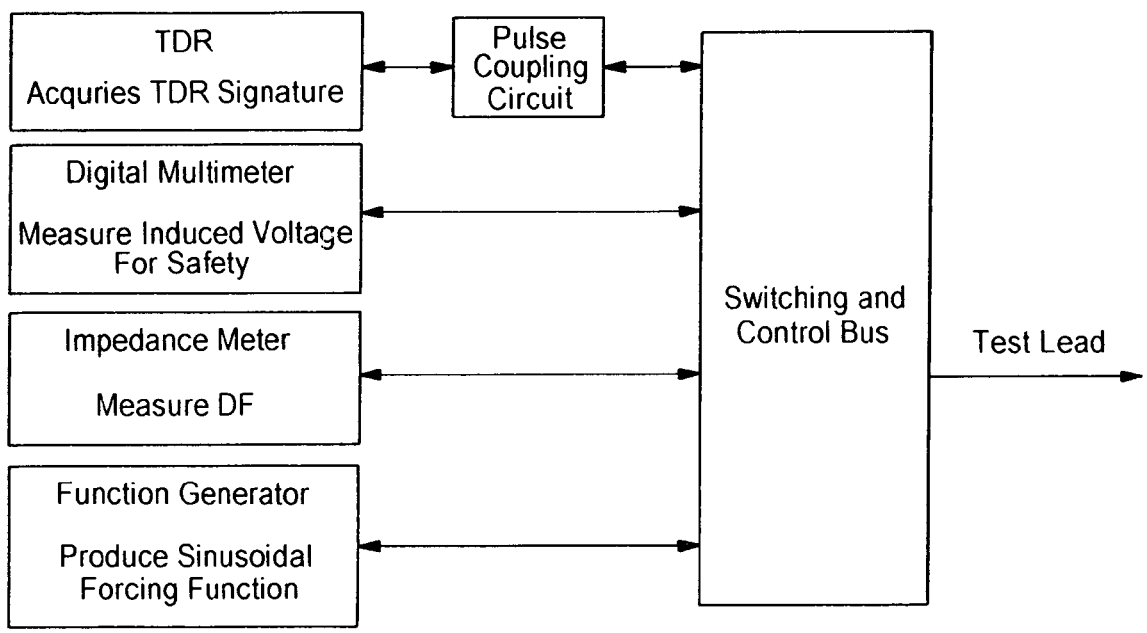
FIG. 2 is a block diagram of the system of one embodiment of the present invention.
Figure 3:
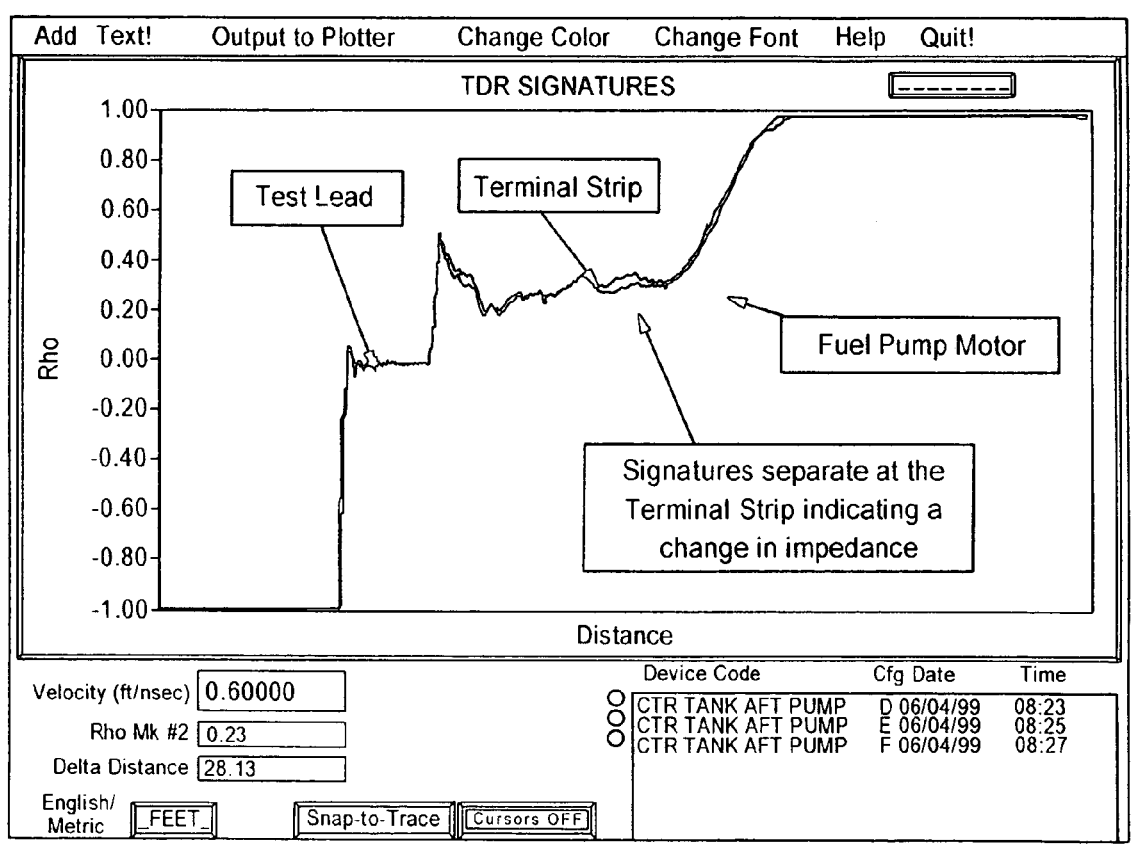
FIG. 3 shows 2 TDR signatures (curves of voltage versus distance along a wire under test), one collected while the wire is not excited by an AC voltage and one collected while the wire is so excited.

FIG. 2 shows the apparatus of one embodiment of the present invention, which takes advantage of the DF properties shown in FIG. 1. The apparatus includes a TDR instrument, a function generator, an impedance meter (optional), and a digital multimeter, each of which is connected via a switching and control bus to a test lead of a wire to be tested. Interposed between the TDR instrument and the switching and control bus is a pulse coupling circuit.

The switching and control bus serves to integrate the operation of the other components of the apparatus and to prevent damage to the wire under test such as could be caused, for example, by an application of excessive voltage. The digital multimeter measures the AC and DC voltage present on the wire under test and the resistance across the connected test lead. If a dangerous level of voltage exists, the switching and control bus prevents testing from proceeding.

In operation, the TDR instrument generates a TDR signal and injects this signal into the wire under test via the test lead. The injected TDR signal travels down the wire away from the injection point. If the impedance all along the wire were identical to the source impedance of the TDR pulse generator, the TDR signal would not be reflected back toward the injection point. However, where there is an impedance different from the source impedance, such as may be caused by a defect or fault in the wire, the TDR signal will be reflected back toward the injection point. The defect or fault causes the TDR pulse to be reflected back at the point of the defect or fault. The TDR signal that is reflected back to the injection point is captured and recorded by the TDR instrument as a TDR signature.

The TDR instrument has timing means to monitor the time at which the TDR pulse is injected into the wire and the time at which the reflected TDR pulse returns to the injection point and is captured by the TDR. The TDR instrument also has calculation means for calculating the distance between the injection point and the defect or fault, based on the monitored round-trip travel time of the pulse and the speed of the pulse, which is known in advance. This distance is equal to one half of the product of the speed and the round-trip travel time. In this way, the TDR instrument determines the location of the defect or fault.

The TDR instrument may further include computer and display means, including analog-to-digital conversion means, for generating and displaying an image of the TDR signature, or voltage waveform, as a graph of voltage (y coordinate) versus distance (x coordinate), as shown in FIGS. 3, 4A–4C, and 5–8. The TDR instrument also has memory means for storing multiple TDR signatures and comparison means for comparing multiple TDR signatures, or graphical displays thereof. Comparisons may be made, for example, between TDR signatures, or their graphical displays, which have been acquired from the same wire under different test conditions, or from different wires under the same test conditions. The way in which the TDR determines the nature and magnitude of the defect or fault will be explained below.

The function generator, which may be a variable frequency signal generator, is used to generate a low frequency AC voltage (also referred to as a forcing function or forcing waveform) and apply it to the wire so as to excite the wire. This excitation voltage is coupled onto the wire under test via a pulse coupling circuit (bias tee). The pulse coupling circuit, or coupling network, consists of an AC forcing function coupling network and a TDR pulse coupling network. The AC forcing function coupling network allows the low frequency excitation signal to be introduced on to the wire under test and presents a high impedance (open circuit) to the TDR. The TDR coupling network is preferably a high pass filter and it attenuates the low frequency AC forcing function while allowing the high frequency components of the TDR pulse to propagate into the wire under test. The pulse coupling circuit thus isolates power from the excited wire under test so as to prevent damage which it might cause to the TDR transducer.

The AC voltage applied to the wire under test is preferably a sine wave, but a square wave, triangle wave, sawtooth wave or other waveform may also be used. Different waveforms will cause the polar insulation molecules to possibly respond differently. An adjustable peak-to-peak voltage of up to 30 volts may be employed, but a lower voltage, for example, approximately 1 volt, may be successfully used. The frequency of the AC voltage used would ideally be the DF peak frequency for the type of wire being tested (i.e., for the type of insulation material). The DF peak frequencies of existing wiring insulation materials are generally known, well-defined values, and are low frequencies. In the case that the DF peak frequency is not known for a given wire, an impedance meter may be used to determine the DF peak frequency by collecting impedance data at several different frequencies. The impedance meter measures impedance and calculates DF and other quantities from impedance.

Since the DF peak frequency is a low frequency, for example, 1 millihertz or 1 microhertz, the period or cycle, i.e. the amount of time of a single wavelength, may be quite long. Testing which employs an AC signal having such a long period can be excessively time-consuming. To overcome this problem, either less than one complete cycle of the AC signal can be used, or frequencies higher than the DF peak frequency can be used.

Figure 9A:
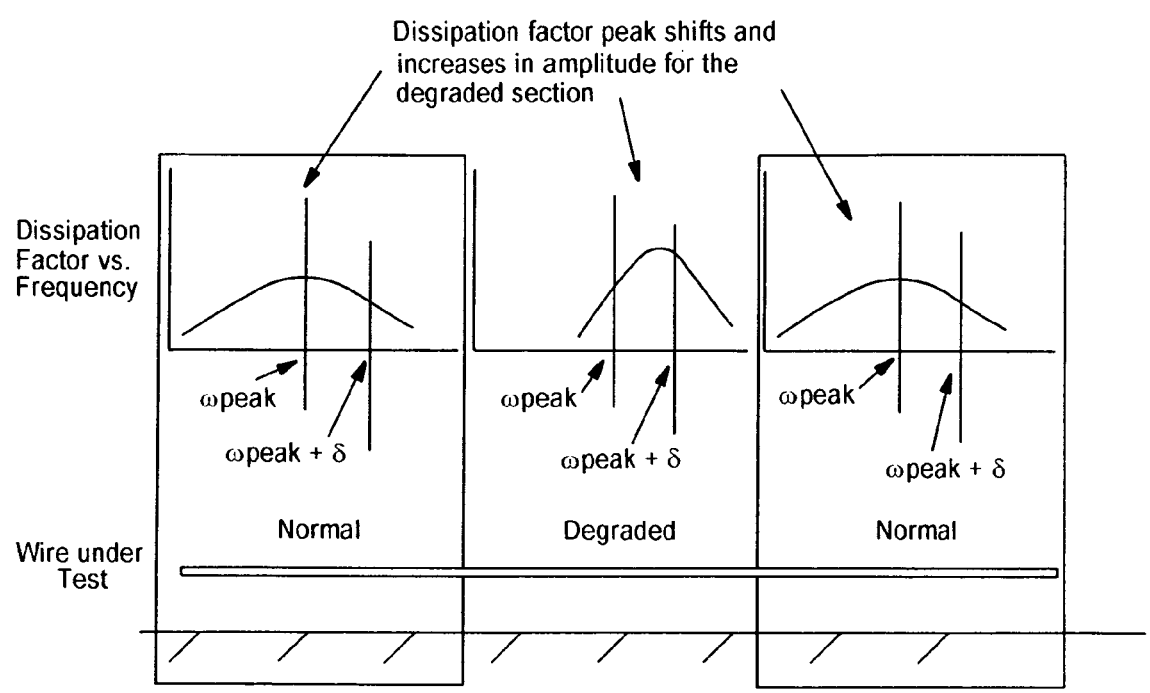
FIG. 9A shows one type of effect that a degraded section of wire can have on the insulation material dissipation factor curve.

It should further be noted that, as insulated wires containing common polar dielectric materials age and degrade (hardening and sometimes ultimately cracking) due to the accumulated effect of environmental conditions, the DF peak frequency shifts to a different frequency. FIG. 9A shows an example of a shift in the dissipation factor curve for a degraded section of an insulated wire. The wire shown in the bottom of FIG. 9A is representative of a typical installation where one section (in this example, the middle) is degraded. The three dissipation factor (DF) curves shown in the top of FIG. 9A are representative of typical polar insulating materials. The normal curves are shown above the beginning and end of the wire section. Note, that the maximum DF value occurs at $\omega_{peak}$. For the degraded section (the middle), the DF curve has shifted in frequency and has increased in amplitude. Note that, in this example, the new peak occurs near $\omega_{peak}+\delta$. Therefore, in using DF testing to monitor and detect losses in the integrity of wiring, rather than comparing the DF values of the wire under test and a reference wire at a single frequency, it has been shown to be desirable to compare a set of DF values, obtained at different frequencies, for the wire under test, with a set of DF values, obtained at the same various frequencies, for the reference wire.

Figure 9B:
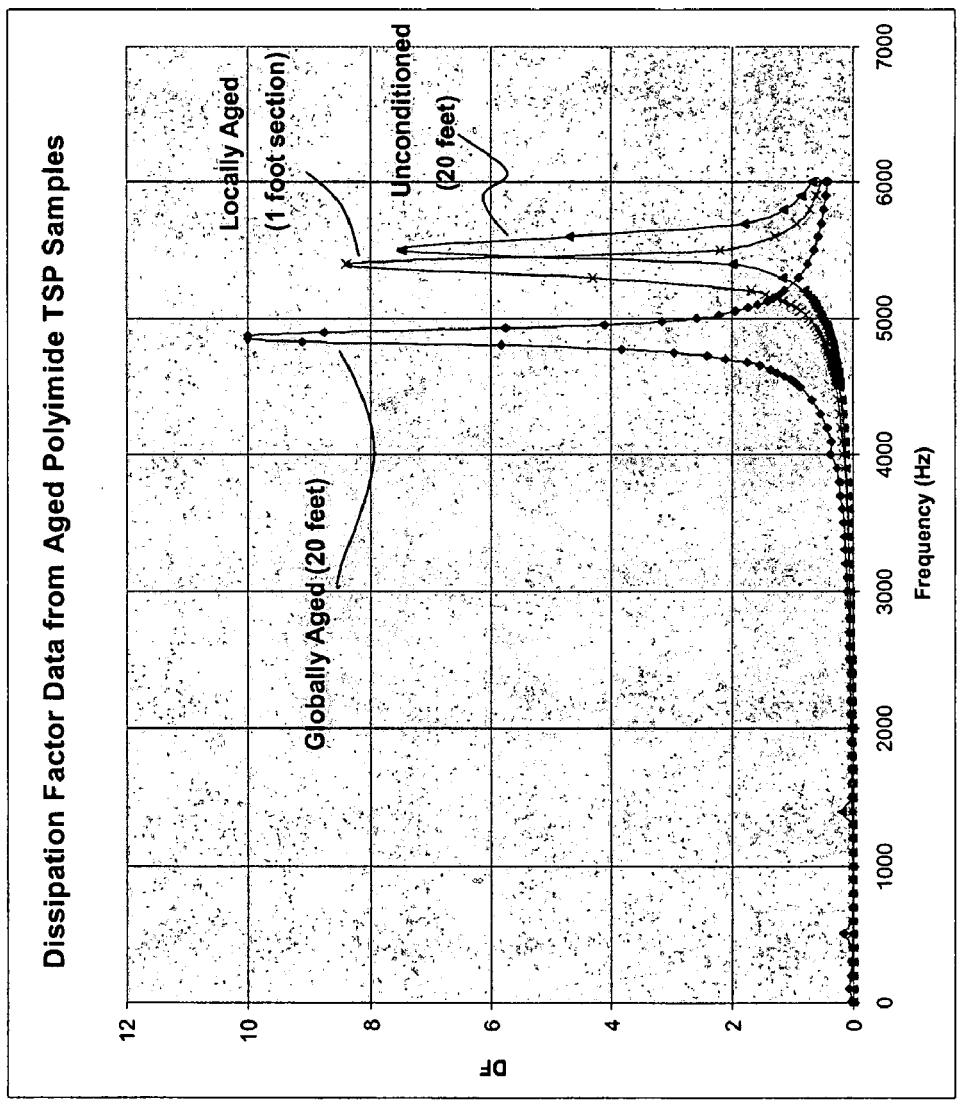
FIG. 9B is an example of actual dissipation factor data from a polyimide insulated wire sample showing the peak frequency changing due to a wire section damaged by excessive heat.

FIG. 9B is an example of actual dissipation factor data showing the frequency of the maximum dissipation factor value ($\omega_{peak}$) changing due to degraded insulation. The curve labeled "Unconditioned" is from a pristine sample. The data from the unconditioned sample indicate a maximum dissipation at approximately 5.5 kHz. When a one (1) foot section of the pristine sample was aged and retested, the curve labeled "Locally Aged", the maximum dissipation factor value increased and the frequency ($\omega_{peak}$) decreased to 5.4 kHz. When the entire sample was aged and retested, the curve labeled "Globally Aged", the maximum increased again and the frequency ($\omega_{peak}$) decreased to approximately 4.85 kHz.

The characteristics of the AC signal, such as type of waveform, voltage and frequency, are selected according to the characteristics of the particular insulation material of the wire being tested and the particular type of defect or fault being tested for. The characteristics of the AC signal may be adjusted to achieve optimal detection for a given type of defect and/or for a given type of wire insulation material.

According to the present invention, a wire is tested by obtaining and comparing two or more TDR signatures from the wire. One TDR signature is obtained by injecting a TDR pulse into the wire without any excitation voltage being applied to the wire. The other TDR signature(s) is/are obtained by injecting a TDR pulse into the wire while an AC excitation voltage is being applied to the wire.

For example, a given test may include the collection of four TDR signatures from a wire, each of the four obtained under a different test condition. One TDR signature is obtained while the wire is an unexcited state. A second TDR signature is obtained while the wire is excited by an AC voltage having a frequency of $\omega_{peak}$, i.e. the DF peak frequency. A third TDR signature is obtained while the wire is excited by an AC voltage having a frequency of ($\omega_{peak}+\delta$). A fourth TDR signature is obtained while the wire is excited by an AC voltage having a frequency of ($\omega_{peak}-\delta$).

The above test configuration is only one example of a possible test configuration. Many other configurations may also be used. Thus in another embodiment of the present invention, only a single AC voltage is used, having a frequency at or near the DF peak frequency, or as near to the DF peak frequency as possible, while still allowing for practicable durations of test run time. In this embodiment there are collected a TDR signature from the wire in an unexcited state and a TDR signature from the wire excited by the AC voltage. In yet another embodiment, two different AC voltages are used, one of which has a frequency which yields a higher DF than the frequency of the other yields. In this embodiment, there are collected a TDR signature from the wire in an unexcited state, a TDR signature from the wire excited by the first AC voltage, and a TDR signature from the wire excited by the second AC voltage.

In another embodiment, three different AC voltages are used, one having a frequency at or near (or as near as practicable to) the DF peak frequency, and the other two having, respectively, frequencies equal to the frequency of the first ±δ. In this embodiment there are collected a TDR signature from the wire in an unexcited state, and three TDR signatures, respectively, from the wire when excited by each of the voltages.

After the TDR signatures are collected, they are analyzed and compared. The digital multimeter is used to measure the voltage over the wire. If there is a defect or fault in the wire, the TDR signature (e.g. as a graph of DF, impedance or voltage versus distance along the wire) will show a change from the value it would have for the same wire lacking defects or faults. Furthermore, as explained above, the excitation voltage enhances the sensitivity of the TDR response, i.e. increases this change in value. Thus, the difference between a TDR signature at the defect or fault point and a TDR signature at a portion of good wire is increased over what the difference would be if the wire were not excited. The reason for this increase in the difference between the TDR signatures is that the excitation of the wire at or near the peak DF frequency causes the DF to reach or approach a peak, and what the TDR signatures are effectively measuring is DF, inasmuch as they are measuring quantities (e.g. voltage or impedance) which are a function of DF.

Figure 4A:
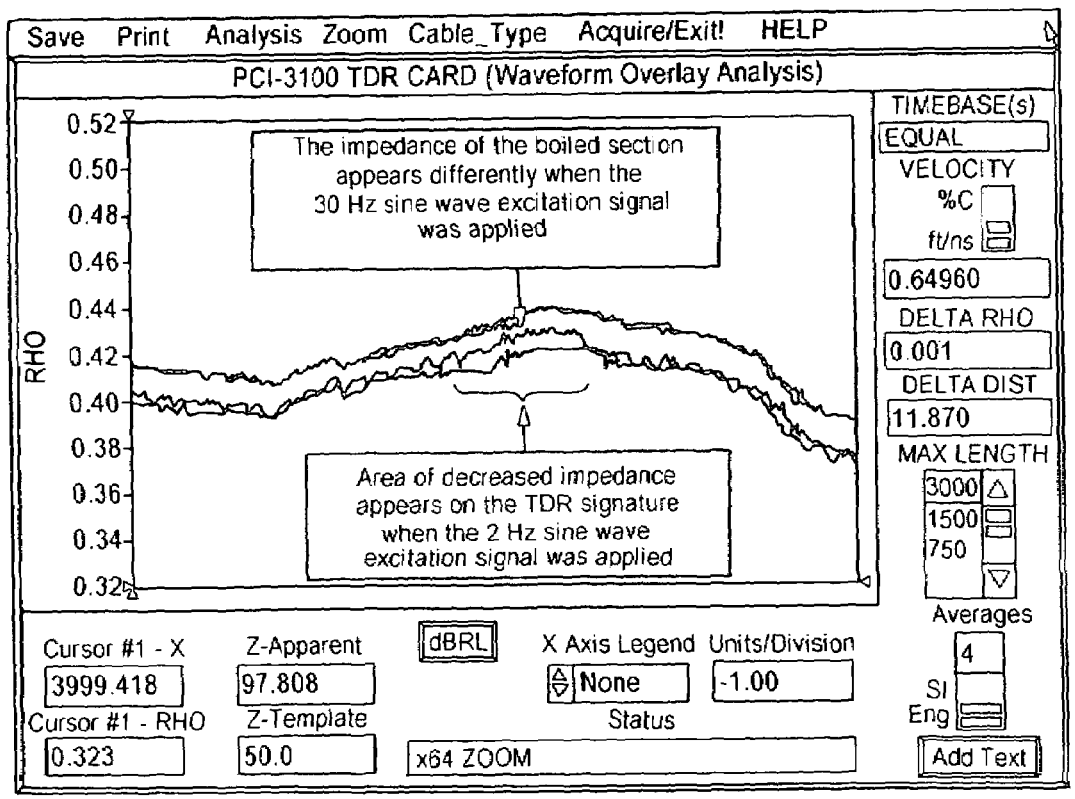
FIGS. 4A–4C show a fantail pattern, containing 4 TDR signatures, one collected while the wire is not excited by an AC voltage and three collected while the wire is excited by AC voltages at different frequencies.
Figure 4B:
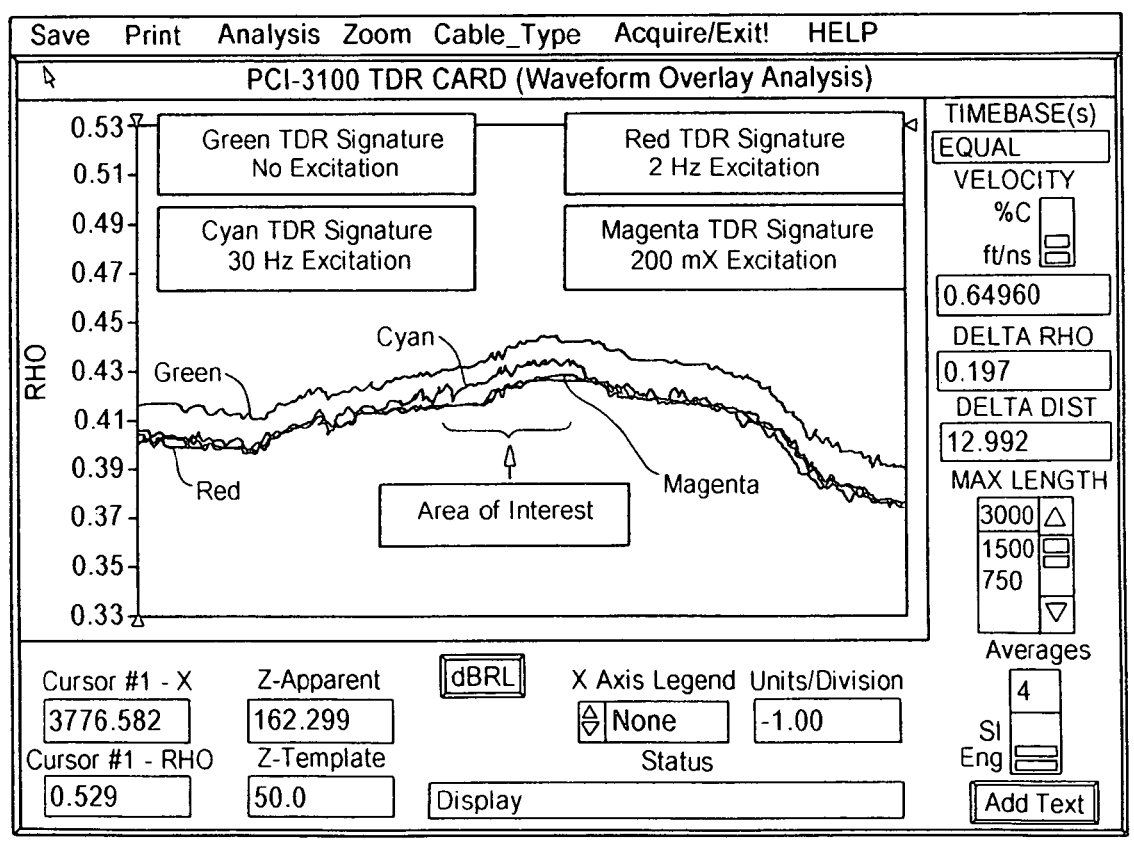
Figure 4C:
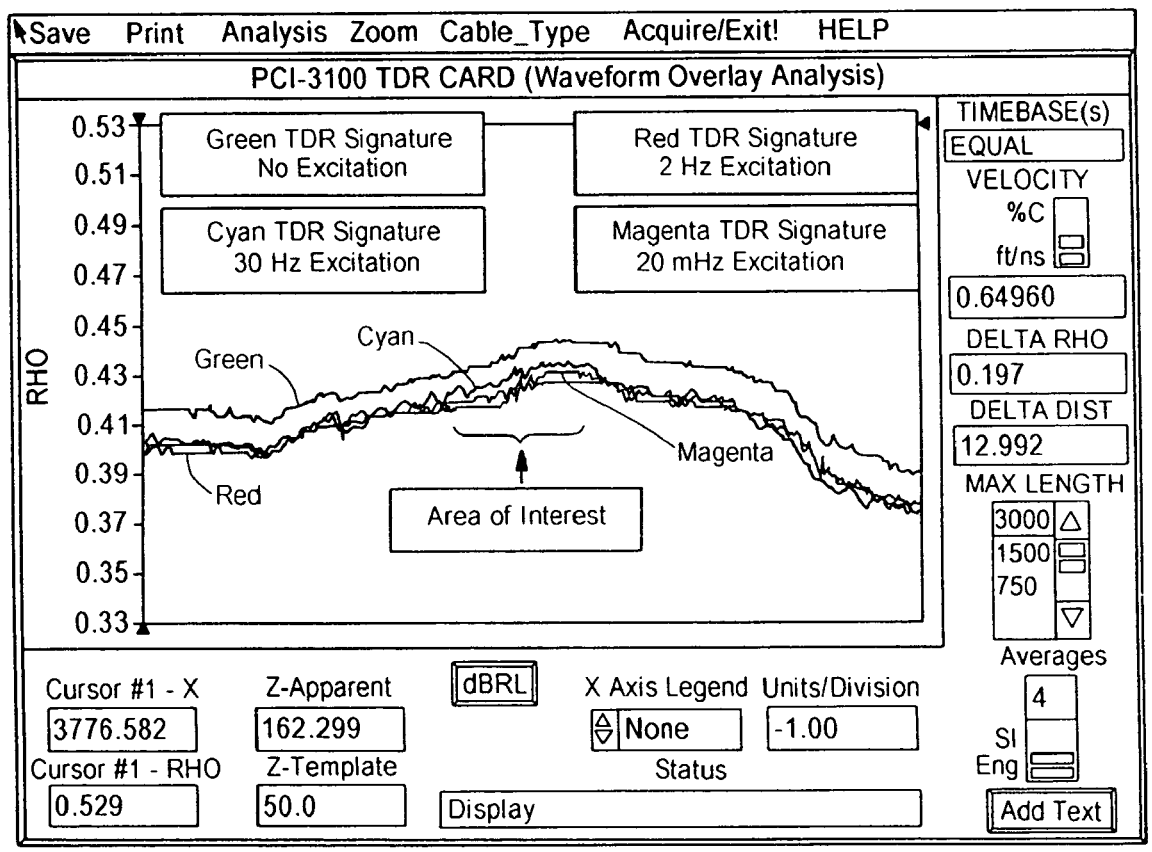

The enhanced difference between the TDR signatures will appear graphically as a separation between the signatures or waveforms. This separation is readily discernible when the two or more signatures are overlaid on a single set of set of x-y coordinates. In the example discussed above, where four TDR signatures are collected, using three AC voltages having, respectively, DF peak frequency and DF peak frequency ±δ, the separation between the signatures when they are overlaid is particularly identifiable, forming a "fantail" pattern, as seen in FIGS. 4A–4C. For a case of two TDR signatures, one obtained from an excited wire and one obtained from an unexcited wire, FIGS. 3, 5 and 8 all show a separation indicating a defect or fault. In either case, the separation between the TDR signatures embodies the information for determining the location, type and magnitude of the defect or fault.

The way in which the location of the defect or fault is determined has already been explained. The location of the separation along the x axis represents the distance along the wire from the TDR injection point to the defect or fault. The distance is calculated from the travel time and the speed of the TDR pulse.

Figure 5:
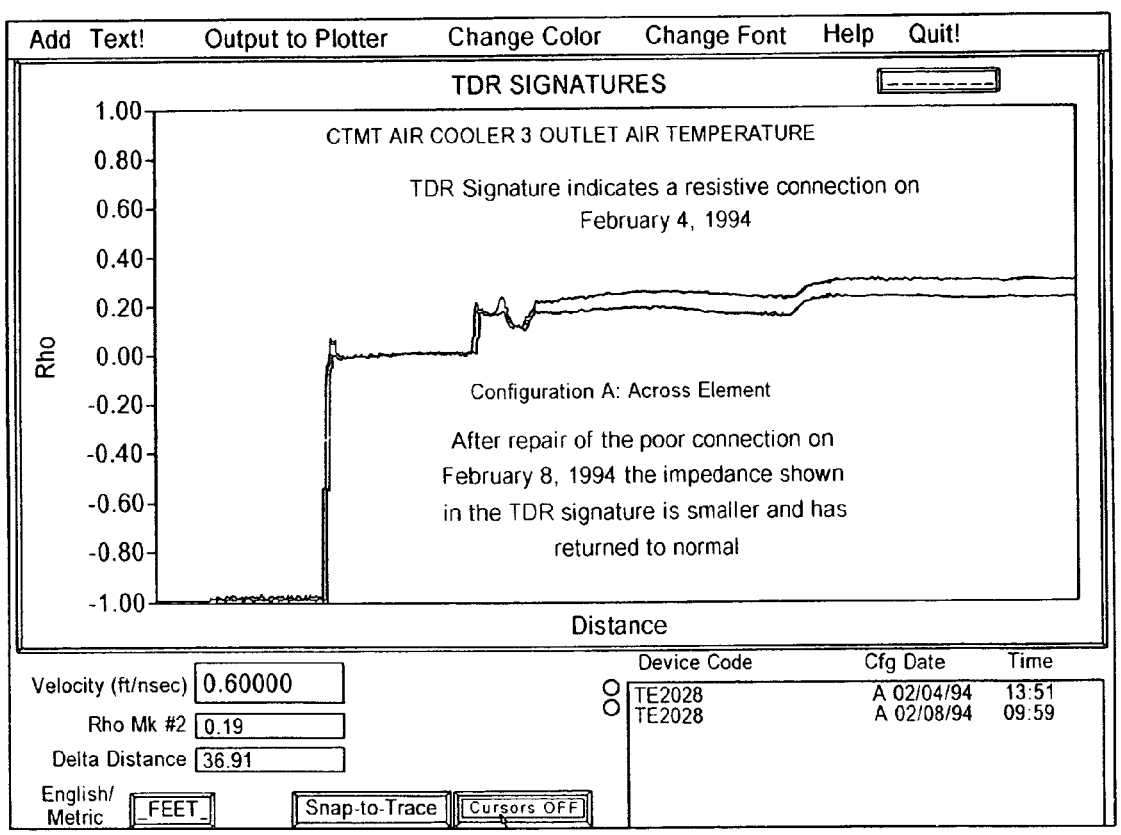
FIG. 5 shows 2 TDR signatures detecting a defect, in particular a resistive connection, in a wire under test.
Figure 6:
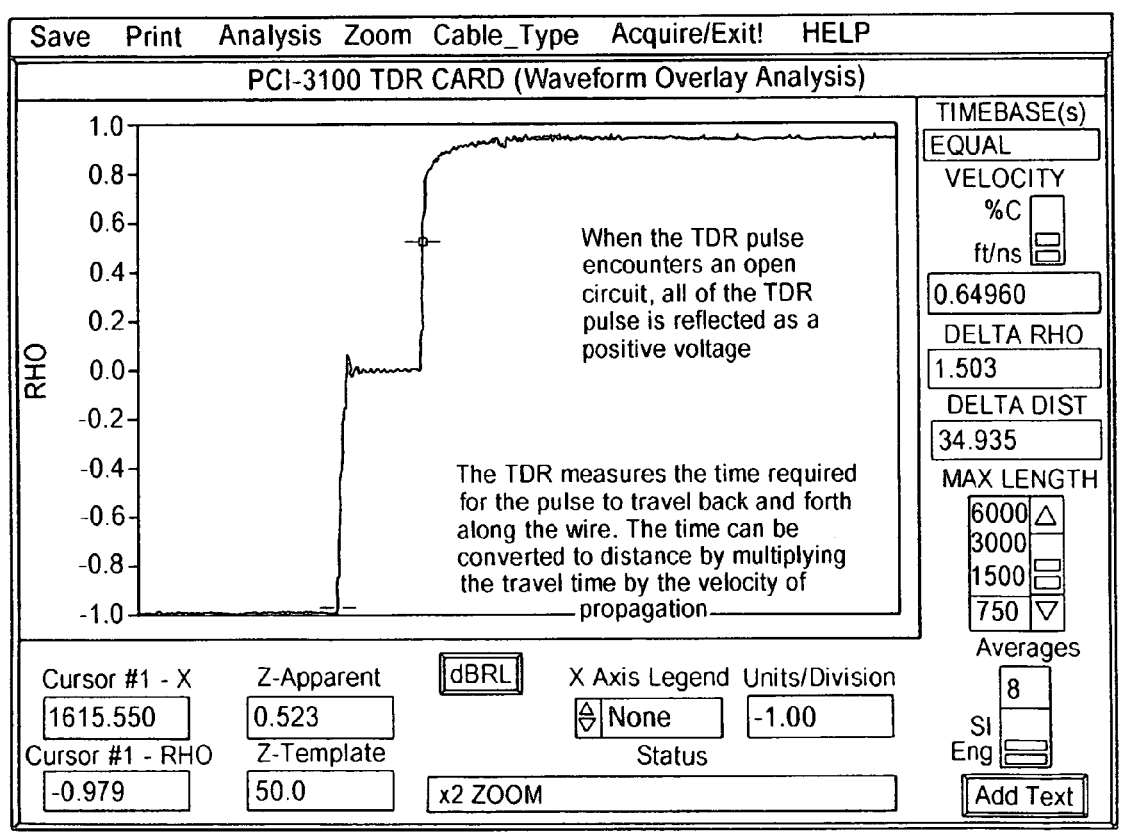
FIG. 6 shows a TDR signature detecting an open circuit.
Figure 7:
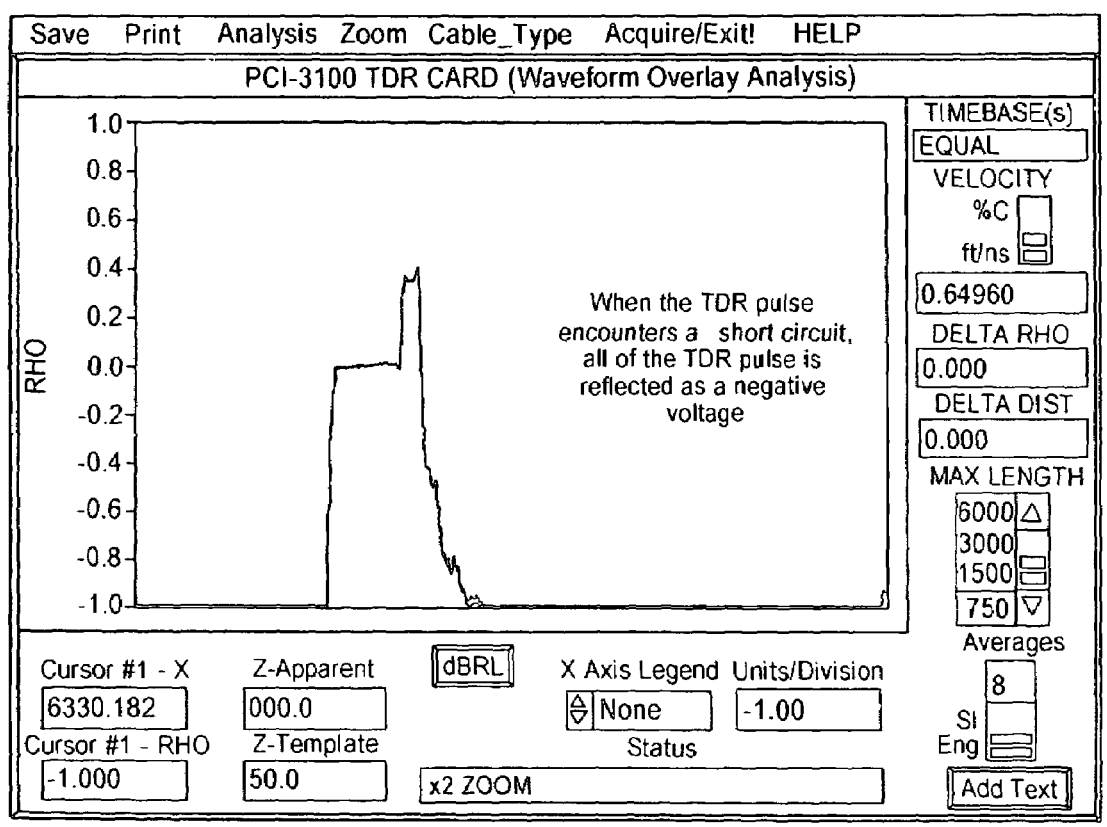
FIG. 7 shows a TDR signature detecting a short circuit.
Figure 8:
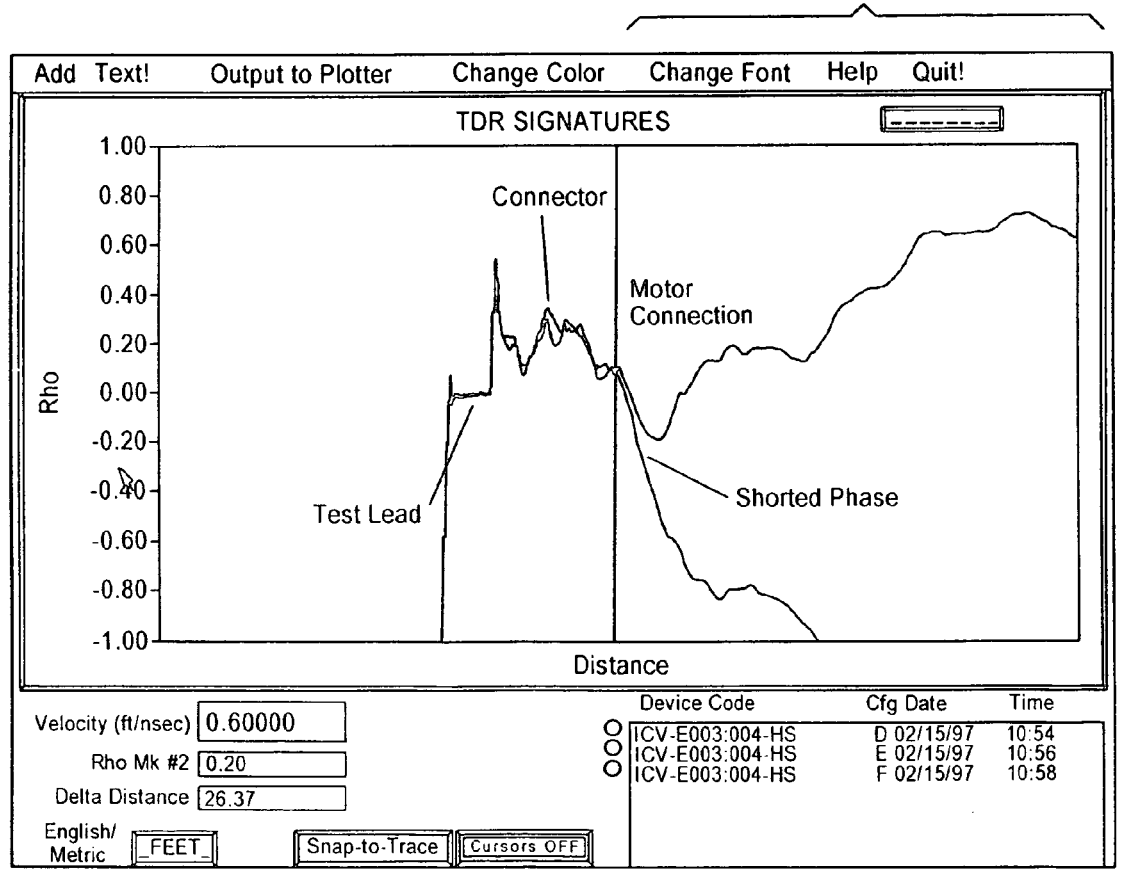
FIG. 8 shows 2 TDR signatures detecting a fault in a device connected to a wire.

The type of the defect or fault may be determined by the nature of the change in the TDR signature obtained from the excited wire, i.e. the direction of separation of that TDR signature. For example, if the TDR signature obtained from the excited wire exhibits a bump or rise in the voltage waveform (i.e. rising above the TDR signature obtained from the unexcited wire), which corresponds to an increase in voltage (and impedance) and a decrease in DF, this indicates a resistive problem, such as a rusty terminal block. FIG. 5 illustrates such a case. If the TDR signature obtained from the excited wire exhibits a dip or decline in the voltage waveform (i.e. dipping below the TDR signature obtained from the unexcited wire), which corresponds to a decrease in voltage (and impedance) and an increase in DF, this indicates an increase in capacitance, a condition that can be caused, for example, by moisture intrusion. At the extremes, if the voltage waveform from the excited wire shot up or down completely to the top or bottom, respectively, of the scale, this would indicate an open circuit (FIG. 6) or short circuit (FIG. 7), respectively.

The magnitude of the defect or fault may be determined from the magnitude of the difference or separation between the TDR signature from the unexcited wire and the TDR signature from the excited wire. Thus in FIGS. 3, 4A–4C and 5 the change in amplitude of the voltage between the two signatures corresponds to, is proportional to, the magnitude of the defect or fault. Again, the cases of the open circuit (FIG. 6) and the short circuit (FIG. 7), where the magnitude of the difference or separation between the signatures goes off the scale in either direction, represent the extreme or limiting cases.

The location, type and magnitude of the defect or fault thus are determined in practice by overlaying and graphically comparing the multiple TDR signatures. This overlaying and graphical comparison of the TDR signatures may be carried out rapidly by using computer-generated images.

In another embodiment, a pulse waveform (i.e., TDR waveform) is transmitted through the wire in combination with a forcing waveform, without separately transmitting the pulse waveform by itself. That is, the TDR pulse waveform begins commensurate with the forcing function. The reflected TDR pulse data and forcing function data are then used to measure changes in the dissipation factor values along the wire. Thus, the trivial case of measuring the reflected signals of just the pulse waveform is not necessary.

The forcing generator can be set to a predetermined frequency in accordance with the particular type of wire being monitored. The presence of a defect and/or fault can thus be determined using one initial transmission. For example, the device can be configured by inputting the type of wire conductor and/or wire insulation materials or by simply entering a particular frequency. The preset frequency can be determined either empirically by measuring it while testing a wire of known length, or by referring to standard tables available from wire manufacturers. Alternatively, the frequency of the forcing generator can be swept between $\omega_{min}$ and $\omega_{max}$, where $\omega_{peak}$ is greater than $\omega_{min}$ and less than $\omega_{max}$. Preferably, the frequency sweep is performed commensurate with the pulse waveforms.

Figure 11:
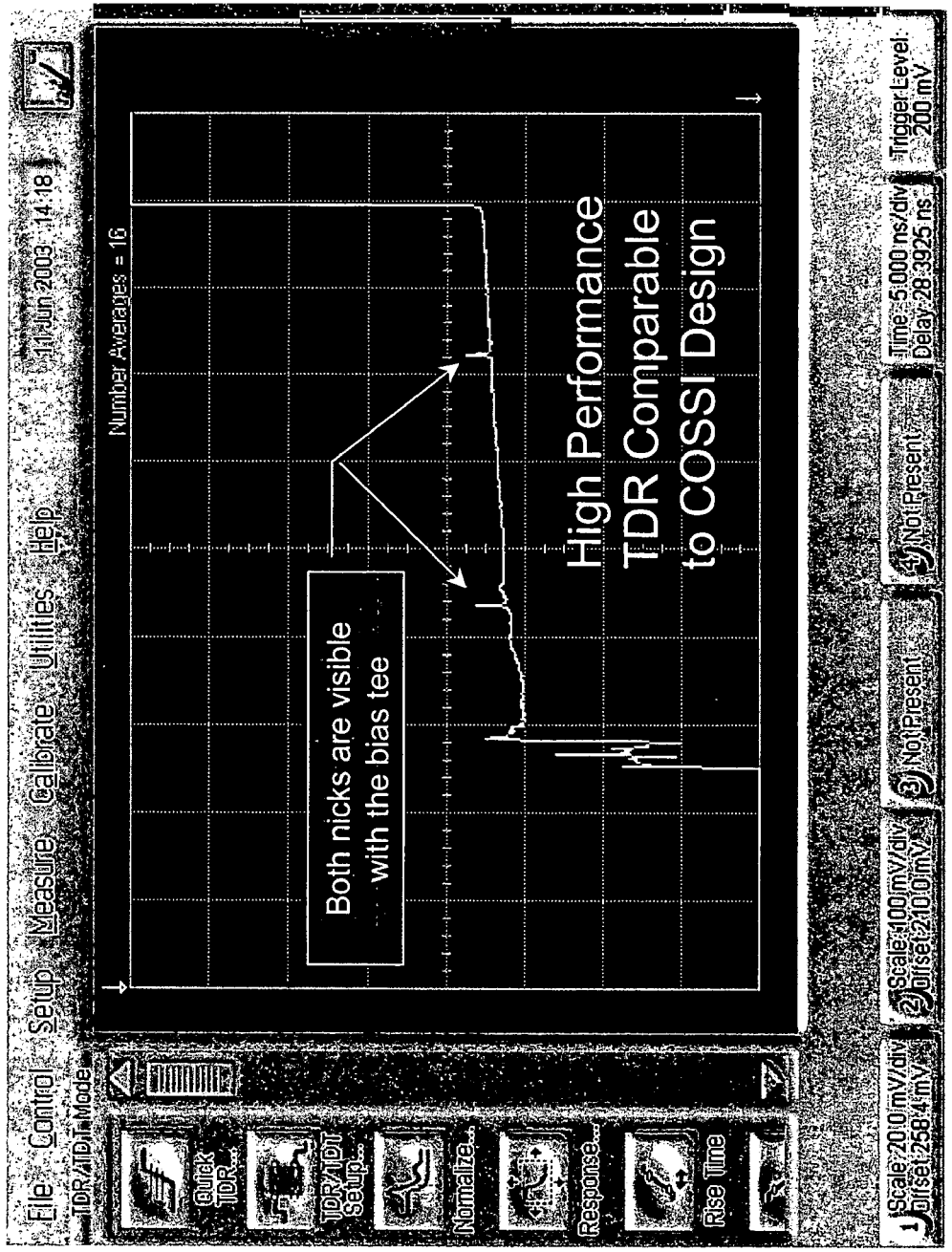
FIG. 11 shows a standard TDR signature (non-excited dielectric test or EDT) of a wire sample with two nicks.

FIG. 11 shows a standard TDR signature (non-excited dielectric test or EDT) of a wire sample with two nicks present. The nicks are identified on the diagram.

Figure 12:
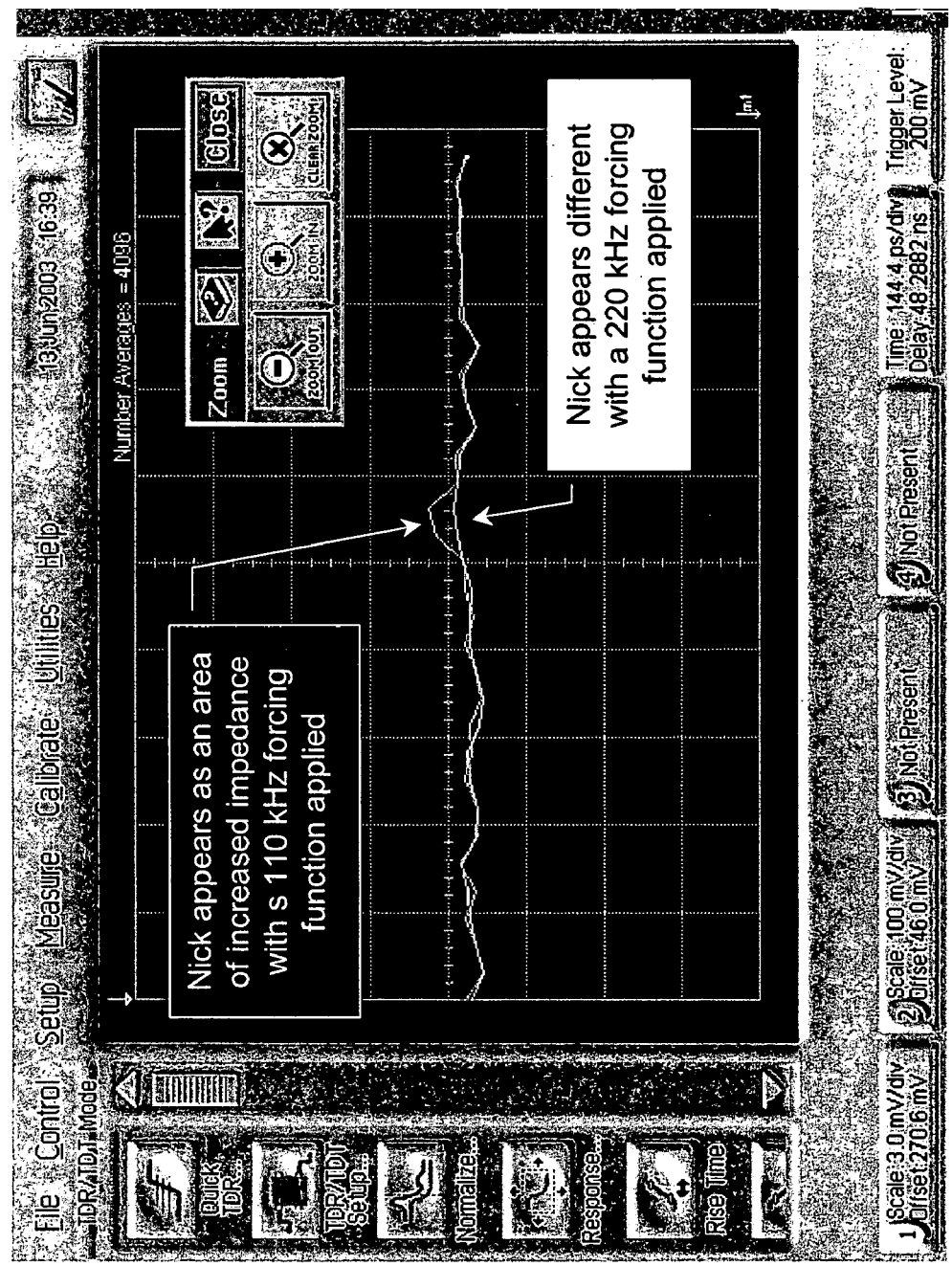
FIG. 12 is a magnification of one of the nicks shown in FIG. 12, tested at two different forcing function frequencies.

FIG. 12 is a magnification of one of the nicks shown in FIG. 11. Two EDT signatures are shown: one with a forcing function of 110 kHz and the other signature with a forcing function of 220 kHz. In this example, the nick appears more pronounced at 110 kHz compared to the 220 kHz forcing function.

In another embodiment of the present invention the forcing function is non-electrical. Instead of transmitting electrical signals through the wire, the forcing function generator would stimulate the wire using thermal or mechanical means. For example, in the case of a thermal forcing function, a heat generator can be used; in the case of a mechanical forcing function, a vibration source can be used.

The thermal forcing function temperature can be predetermined for a particular type of wire. For example, a preset temperature representative of the worst-case environment for an installed wire can be used. The temperature can also be determined by referring to data available from wire manufacturers that specify the minimum and maximum operating temperatures. Alternatively, the heat generator can be set to sweep the thermal forcing function between a temperature range of $T_{min}$ and $T_{max}$, where $T_{peak}$, the temperature at which the maximum dissipation factor occurs is greater than $T_{min}$ and less than $T_{max}$.

Similarly, the source producing the mechanical forcing function can be set to a predetermined vibration frequency in accordance with a type of wire being monitored and/or the environment associated with the installation. The vibration frequency is determined either through experimentation, or by referring to specifications available from wire manufacturers. Alternatively, the vibration source can be set to sweep the mechanical forcing function between a frequency range of $\omega_{min}$ and $\omega_{max}$, where $\omega_{peak}$, the frequency at which the maximum dissipation factor occurs, is greater than $\omega_{min}$ and less than $\omega_{max}$.

According to the present invention, it is possible not only to detect a single defect or fault in a wire, but also multiple defects or faults in the same wire. However, if a wire contains a fault such as an open circuit or short circuit, a defect or fault occurring in the wire beyond such a fault could not be detected. The locations, nature and magnitude of the defects/faults are determined in the same manner as for the case of a single defect or fault.

In addition, according to the present invention, not only may defects or faults in a wire be detected, but also defects or faults in a device connected to a wire may be detected. In such an application of the present invention, the device is represented as a certain section of the TDR waveform. See FIG. 8, which illustrates detection of a defect or fault in a device. Since the location (distance from the injection point) of the device can be determined, that portion of the TDR signature corresponding to the device can be known. If a defect or fault appears in the portion of the TDR waveform corresponding to the device, this indicates a defect or fault in the device. Thus, it can be determined whether a defect or fault is in the wiring or in the device. The type and magnitude of a defect or fault in a device may be determined in similar fashion as has been explained for the case of a defect or fault in the wiring.

Further, the present invention can be used not only to detect defects and faults in polar dielectric materials, but also to detect polar contaminants, such as water, in non-polar dielectric materials. Since, as shown in FIG. 1, non-polar dielectric materials exhibit a flat or uniform curve of DF versus frequency of applied AC voltage, the presence of a peak in a DF curve obtained from a non-polar material may indicate the presence of a polar contaminant. On a TDR signature, such a peak (increase) in DF would correspond to a decrease in voltage, since DF and voltage are inversely proportional. Thus the TDR signatures of the present invention can be used to detect the presence of polar contaminants in non-polar dielectric materials. In such an application of the present invention, a dip in the voltage waveform would indicate the presence of a polar contaminant.

Figure 10:
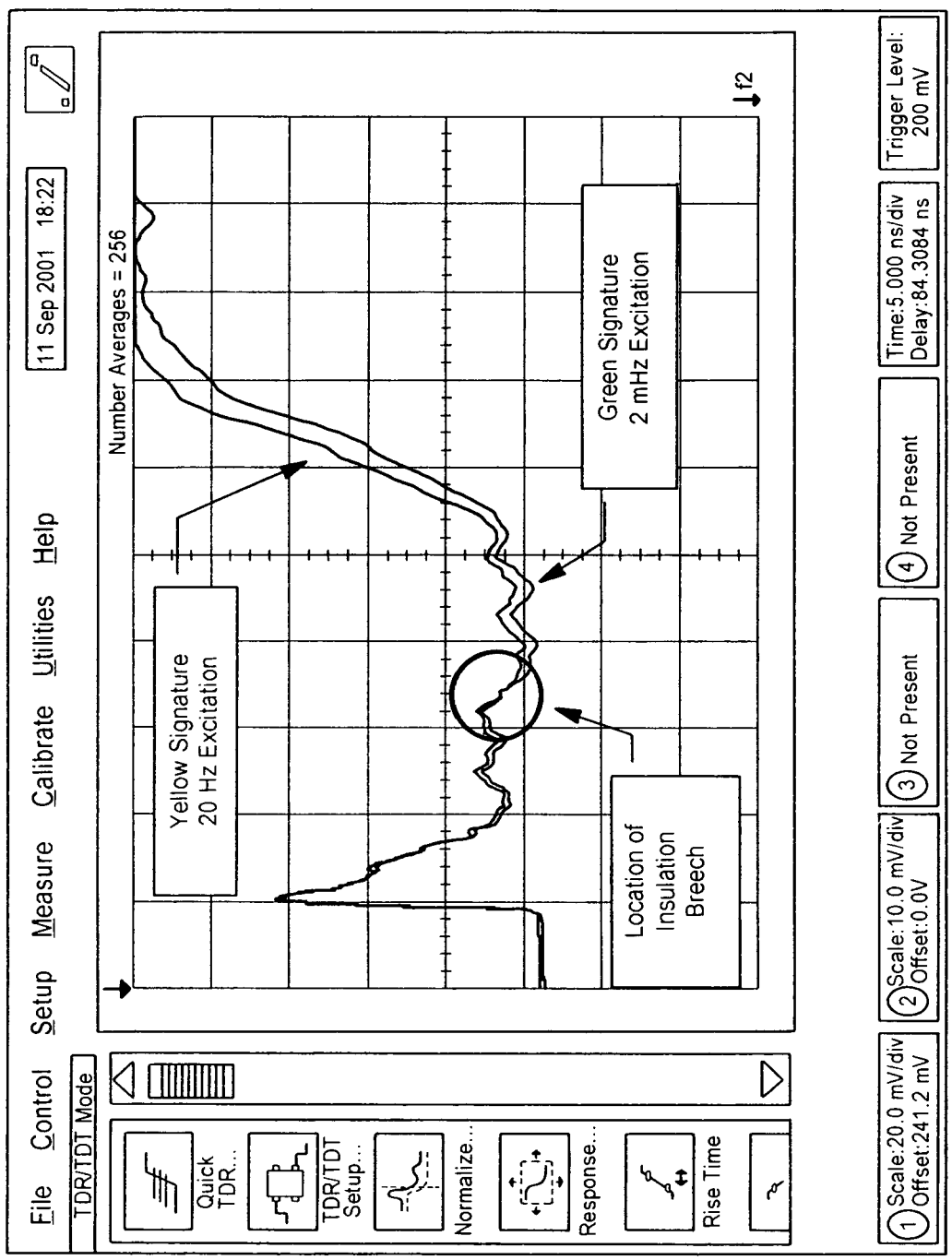
FIG. 10 is an example of the excited dielectric test method on a wire containing an insulation breach.

The present invention is designed to optimally monitor and test wiring in the aircraft environment, e.g. the types and characteristics of wiring typically used in aircraft and the types and characteristics of degradation of wiring typically encountered in aircraft. Examples of typical aircraft wiring and degradation, with respect to which the present invention may successfully monitor and detect losses in wiring integrity follow. Typical aircraft wiring uses polyimide (Kapton®) and cross-linked ETFE (Tefzel®) as insulation material. Aircraft wires are generally single unshielded wires laced together to form a harness. The length of aircraft wiring is on the order of 100 feet and typical wire size ranges from #16AWG to #24AWG. Degradation typically encountered in the environment of installed aircraft wiring include, for example, nicks, chafing, tears, poor conductor contacts and moisture intrusion, which may be caused, for example, by mechanical abrasion, contamination by water, hydraulic fluid or other fluids used in aircraft, and extreme operating temperatures such as very high temperatures near engines and sub-zero temperatures along the leading wind edges. An example of applying the present invention to aircraft wiring is shown in FIG. 10. In this example, two excited waveforms with different forcing functions are being compared. The point at which the waveforms cross (circled area) represents the location of the insulation breech.

While the present invention has been described in detail with reference to the preferred embodiments thereof, many modifications and variations thereof will be readily apparent to those skilled in the art. Accordingly, the scope of the invention is not to be limited by the details of the preferred embodiments described above, but only by the terms of the appended claims.

What is claimed is:

1. An apparatus for monitoring integrity of a wire, comprising:

a pulse generator for generating a pulse waveform for transmission through the wire;

a function generator for generating a forcing waveform for transmission through the wire, wherein the pulse waveform is transmitted through the wire in combination with the forcing waveforms; and a detector adapted to measure the change in dissipation factor values along the wire.

2. An apparatus according to claim 1, further comprising a coupling circuit arranged between the pulse generator and the wire.

3. An apparatus according to claim 2, wherein the coupling circuit comprises a high pass filter to isolate the pulse generator from the forcing waveform.

4. An apparatus according to claim 1, wherein the forcing waveform is at a predetermined frequency in accordance with a type of wire insulation material and/or a type of wire conductor material.

5. An apparatus according to claim 1, further comprising a digital multimeter for measuring a voltage induced in the wire.

6. An apparatus according to claim 1, further comprising an impedance meter for measuring the dissipation factor values of the wire.

7. An apparatus according to claim 1, wherein the function generator sweeps the forcing waveform between a frequency range of $\omega_{min}$ and $\omega_{max}$, where $\omega_{peak}$ is greater than $\omega_{min}$ and less than $\omega_{max}$.

8. A method for monitoring integrity of a wire, comprising the steps of:

generating a pulse waveform for transmission through the wire;

generating a forcing waveform for transmission through the wire;

transmitting the pulse waveform through the wire in combination with the forcing waveform; and measuring a change in dissipation factor values along the wire.

9. A method according to claim 8, wherein the forcing waveform is at a predetermined frequency in accordance with a wire insulation material and/or a wire conductor material.

10. A method according to claim 8, further comprising a step of measuring a reflected waveform from the transmitted pulse waveform.

11. A method according to claim 8, further comprising a step of isolating the pulse waveform from the forcing waveform.

12. A method according to claim 8, further comprising a step of sweeping the forcing waveform between a frequency range of $\omega_{min}$ and $\omega_{max}$, where $\omega_{peak}$ is greater than $\omega_{min}$ and less than $\omega_{max}$.

* * * * *